(12) United States Patent
Bauer et al.

(10) Patent No.: US 7,602,614 B2
(45) Date of Patent: Oct. 13, 2009

(54) ELECTRONIC MODULE AND METHOD FOR THE PRODUCTION THEREOF

(75) Inventors: Michael Bauer, Nittendorf (DE); Wolfram Eurskens, Unterhaching (DE); Rudolf Kerler, Lappersdorf (DE); Heinz Pape, Aschheim (DE); Peter Strobel, Regensburg (DE); Stephan Stoeckl, Schwandorf (DE)

(73) Assignee: Infineon Technologies AG, Munich (DE)

( * ) Notice: Subject to any disclaimer, the term of this patent is extended or adjusted under 35 U.S.C. 154(b) by 100 days.

(21) Appl. No.: 10/562,252

(22) PCT Filed: Jun. 4, 2004

(86) PCT No.: PCT/DE2004/001145

§ 371 (c)(1),
(2), (4) Date: Jul. 5, 2006

(87) PCT Pub. No.: WO2005/009094

PCT Pub. Date: Jan. 27, 2005

(65) Prior Publication Data

US 2006/0250781 A1 Nov. 9, 2006

(30) Foreign Application Priority Data

Jun. 27, 2003 (DE) ................. 103 29 143

(51) Int. Cl.
*H05K 7/00* (2006.01)
(52) U.S. Cl. ...................... 361/760; 257/724
(58) Field of Classification Search ........ 257/724; 357/55; 323/74; 364/489; 361/760; 205/125
See application file for complete search history.

(56) References Cited

U.S. PATENT DOCUMENTS

| | | | | |
|---|---|---|---|---|
| 4,016,483 A | * | 4/1977 | Rudin | ................. 323/354 |
| 4,041,476 A | | 8/1977 | Swainson | |
| 4,841,099 A | | 6/1989 | Epstein et al. | |
| 4,970,553 A | | 11/1990 | Orlowski et al. | |
| 5,095,357 A | * | 3/1992 | Andoh et al. | ............. 257/379 |
| 5,148,354 A | | 9/1992 | Roth | |
| 5,644,496 A | * | 7/1997 | Agrawal et al. | ............ 716/17 |
| 5,869,896 A | * | 2/1999 | Baker et al. | ............. 257/724 |
| 6,132,588 A | * | 10/2000 | Yoshizawa et al. | ......... 205/125 |
| 6,222,737 B1 | * | 4/2001 | Ross | ............. 361/767 |
| 6,363,606 B1 | | 4/2002 | Johnson, Jr. et al. | |
| 6,708,051 B1 | * | 3/2004 | Durousseau | ............. 600/383 |
| 2003/0068468 A1 | | 4/2003 | Colea | |
| 2004/0137710 A1 | | 7/2004 | Grigoropoulos et al. | |

FOREIGN PATENT DOCUMENTS

| | | |
|---|---|---|
| DE | 3741916 | 6/1989 |
| DE | 4026417 | 4/1991 |
| DE | 19715898 | 10/1998 |
| DE | 19832560 | 1/1999 |

(Continued)

*Primary Examiner*—Dean A. Reichard
*Assistant Examiner*—Andargie M Aychillhum
(74) *Attorney, Agent, or Firm*—Dicke, Billig, Czaja PLLC (57) ABSTRACT

An electronic module and a method for the production thereof is disclosed. In one embodiment, the electronic module has a plurality of components arranged on a wiring block. The wiring block has a plurality of outer sides and has in its volume lines interconnecting contact pads on the outer sides. The contact pads are electrically connected to component connections of the components.

17 Claims, 6 Drawing Sheets

FOREIGN PATENT DOCUMENTS

| | | |
|---|---|---|
| EP | 0340997 | 11/1989 |
| EP | 1223615 | 7/2002 |
| JP | 6199361 | 7/1994 |
| WO | 01/41517 | 6/2001 |
| WO | 02/23962 | 3/2002 |

* cited by examiner

ELECTRONIC MODULE AND METHOD FOR THE PRODUCTION THEREOF

CROSS-REFERENCE TO RELATED APPLICATION

This Utility Patent Application claims the benefit of the filing date of Application No. DE 103 29 143.1, filed Jun. 27, 2003 and International Application No. PCT/DE2004/001145 filed Jun. 4, 2004, both of which are herein incorporated by reference.

FIELD OF THE INVENTION

The invention relates to an electronic module having components which are electrically connected to a circuit carrier.

BACKGROUND

Such electronic modules have board-type circuit carriers with multilayered rewiring strata. Each rewiring stratum may have an insulating layer and a wiring layer, and also through contacts through the insulating layer. In this case the board-type circuit carrier has rewiring strata on one side or on both sides and is populated with components on one side or on both sides. It is possible to three-dimensionally extend this board-type concept for modules by stacking components on the circuit carrier. In terms of its wiring technique when wiring a stack of components this concept is restricted and constructed in very complex fashion and is cost-intensive in manufacture.

SUMMARY

The present invention provides an electronic module which can be produced cost-effectively, and also a method and a device for producing the module.

In one embodiment, the invention provides an electronic module having a first and a second component with connections on connection sides of the components. The electronic module has a wiring block with contact pads on its outer sides and with lines in its volume. The lines in its volume electrically connect the contact pads on the outer sides to one another in accordance with a circuit layout. In this case, the two components are arranged on different, non-opposite outer sides of the wiring block and their connections are electrically connected to the contact pads.

In one embodiment, wiring block according to the invention is not constructed in strata but rather is based on a plastic volume through which the lines extend according to a circuit layout. Consequently the at least six outer sides of the wiring block can be provided for population with electronic devices or components. A characteristic is that with the aid of the wiring block it is possible to arrange components not only on one side or on both sides on a circuit carrier, but also on the edge sides of the wiring block according to the invention. The possibilities for designing circuits and for realizing circuits are extended on account of the wiring block according to the invention, especially as line nodes at which a plurality of lines are connected together can be provided in any desired number within the wiring block. The line routing in the line block is not limited to vertically and horizontally running lines or through contacts. Rather, it is possible to realize any desired line routing at different solid angles in the wiring block.

The lines within the wiring block may be carbonized plastic if the entire line block is composed of a plastics composition. Such carbonized lines in a plastic block can be realized by supplying energy during the construction of the plastic block or else after the construction of the plastic block. In this case, at interfaces or in the volume of a plastic block energy is fed to the macromolecules of the plastic with the result that the plastic is carbonized in a focus region of the energy source and conductive material is thus formed through carbonization and/or carbon black formation within the plastic.

One advantage of this plastic block with carbonized lines is that it is possible to realize three-dimensional wirings between contact pads to be wired on the outer sides of the wiring block without having to provide complicated rewiring strata or multilayer substrates or through contacts in the wiring block.

Rather, the wiring block made of plastic with carbonized lines may be configured three-dimensionally and in this case have both vertically running and horizontally running lines and also lines at any desired solid angle, thereby achieving effective and short wiring paths in the wiring block. As a result, it is possible to reduce propagation time delays within the electronic module and the line routings can be planned three-dimensionally. By providing spiral or sheetlike formations of lines within the wiring block, it is also possible to provide passive, such as capacitive or inductive, components in the wiring block.

In a further embodiment of the invention, the lines have nanoparticles with carbonized short-circuit paths between the nanoparticles. In this case, the wiring block has filling materials in the form of nanoparticles in addition to the plastic. In order to connect these nanoparticles to one another to form electrical lines, high-energy pulses can carbonize the material between the nanoparticles and thus produce a connecting line.

In further embodiments of the invention, the lines have anisotropically oriented nanoparticles. In this case, filling nanoparticles that are initially present in disordered fashion in the wiring block are oriented anisotropically by alternating electromagnetic fields or by means of microwave citations and can agglomerate to form lines.

The conduction type which predominates in the electronic module and, in particular in the wiring block depends on the one hand on the amount of the addition of nanoparticles and on the other hand on the type of energy supply by electromagnetic excitation or by thermal radiation, and also on the properties of the plastic. The higher the degree of crosslinking of a resin layer surrounding the conductor track, the stabler a conductor track routing. In this case, the resin layer directly adjoining the line can be incipiently cured or cured during carbonization, so that the "carbon black line" is mechanically stabilized.

The transition to the contact pads arranged on the outer sides of the wiring block may be realized by metallizing the ends of the carbonized lines. By means of this concluding metallization at the piercing points of the lines through the outer sides, the carbonized lines are protected against oxidation.

In one embodiment, a device for producing an electronic module has a casting mold for the introduction of plastic. Two focusable energy sources with an orienting device for guiding and superposing the focus regions of the energy sources in the volume of the plastic to be introduced serve for forming lines of the wiring block to be produced. In addition, the device has at least one casting device for the continuous or layer-by-layer filling of the casting mold with plastic with the formation of lines in the provided volume of the wiring block.

Depending on the type of plastic, the lines may be introduced by means of two energy sources directly when the casting mold is being filled with plastic, or, if a transparent plastic such as an acrylic resin is involved, it is also possible, after completing a translucent plastic block, to produce a wiring block therefrom by guiding the focus regions of the energy sources through the block volume. The energy sources may be laser apparatuses having an attachment or accessory for deflecting the laser beam and for superposing two laser beams. At each of the points of intersection of the two laser beams, such a high light intensity arises that the plastic is carbonized at these locations. A microprocessor is used for controlling the energy sources and in particular the laser apparatuses, which microprocessor coordinates the deflection devices for the laser beams in the case of laser apparatuses.

Such a device has the advantage that it can be extended as desired if larger outer sides are required for the wiring block.

For transparent plastics, the focusable energy source has the advantage that lines arise within the plastic at the focal point if the latter leads from an orienting mechanism in a predetermined direction to the formation of lines. For nontransparent plastics, too, a focusable energy source is advantageous, namely on the one hand in order to delimit the local extent of the conductor tracks and on the other hand in order to produce a carbonization of the plastic of the surface, as far as a depth delimited by the focus.

In addition to the casting mold and focusable energy source, the device has a casting device for plastic. Said casting device serves on the one hand for the continuous or layer-by-layer filling of the casting mold with plastic. During the filling or after the filling of a thin layer in each case, connecting lines are introduced into the casting block with the aid of the focusable energy sources, so that a wiring block made of plastic arises. At the same time and continuously or layer by layer, outer areas form at the bottom of the casting mold, at side walls of the casting mold and on the top side of the plastics composition which are to be provided with contact pads at the piercing points of the carbonized lines.

On account of the high availability and high precision, laser apparatuses are preferred as energy sources and are used for this device for the production of an electronic module with a central wiring block. High precision is also avoided by electron beam and ion beam installations, however. Furthermore, it is possible to use ultrasonic energy sources and microwave apparatuses if the intention is to realize sheet-like or layer-type carbonized regions, such as can be produced for example for passive components as capacitor plates in the wiring block.

The type of energy source also determines the type of orienting device. Thus, ion beam and electron beam installations are provided with electromagnetic actuators which permit the electron or ion beam to be guided along lines to be formed. In the case of laser apparatuses, in particular optical deflection means such as polygonal rotating mirrors and upstream or downstream lens systems have proved to be worthwhile in order to guide the deflection of a focused laser beam along planned lines in the wiring block made of plastic.

A method for producing an electronic module having two components on different outer sides of a wiring block having electrical contact pads has the following method steps.

Firstly, plastic is introduced into a casting mold for the production of a plastic blank block. Afterward, it is possible to effect a partial carbonization of the plastic and/or partial agglomeration of nanoparticles in the plastic blank block to form lines of a wiring block according to a predetermined circuit layout by means of radiating in energy of two focused and guided energy beams from energy sources. After the production of the lines in the wiring block and curing of the wiring block, the wiring block is moved from the casting mold. Afterward, contact pads are fitted at the piercing points of the lines on the outer sides of the wiring block. Finally, at the outer areas two or more components for an electronic module may be fitted with their connections on different and not only on opposite outer sides of the wiring block.

A further implementation of the method consists in firstly producing at least one plastic layer with lines and afterward realizing further plastic layers arranged on the first layer. Lines are produced within the layers and from layer to layer by carbonization of the plastic and/or by agglomeration of nanoparticles in the respective plastic layer. In this case, too, the end result is a wiring block having at least six outer sides on which components to be wired of an electronic module can be applied in spatial arrangement with respect to one another.

To summarize, it can be established that the invention provides a medium in the form of a wiring block for electronic modules which has electrically conductive structures or conductor tracks after the supply of heat by means of energy bombardment, it also being possible as an alternative for such structures to arise by means of electromagnetic patterning methods. In this case, the conductor tracks arise through carbonization of the resin or sintering of conductive nanoparticles that are admixed with the resin as filler. After the conclusion of the production of the conductor tracks in the casting resin, the plastic is cured, which may likewise be effected by supplying heat or radiation.

The wiring block thus produced has a parallelepipedal form, on the outer sides of which contact pads can be metallized. In this case, one of the outer sides may serve as a connection pad for a printed circuit board. Semiconductor chips may in each case be applied to the outer sides using flip-chip mounting by means of soldering or adhesive bonding technology. Damaged semiconductor chips or components can be removed from the outer sides at any time and be replaced by functional components, which facilitates servicing, maintenance and repair. The wiring block can be used multiply as a circuit substrate without restrictions. In this case, the method for producing such a wiring block affords the possibility of realizing extremely flexible conductor track arrangements with complex rewirings even at this production level. Furthermore, the wiring block can be embodied cost-effectively in any desired three-dimensional wiring form.

FIELD OF THE INVENTION

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
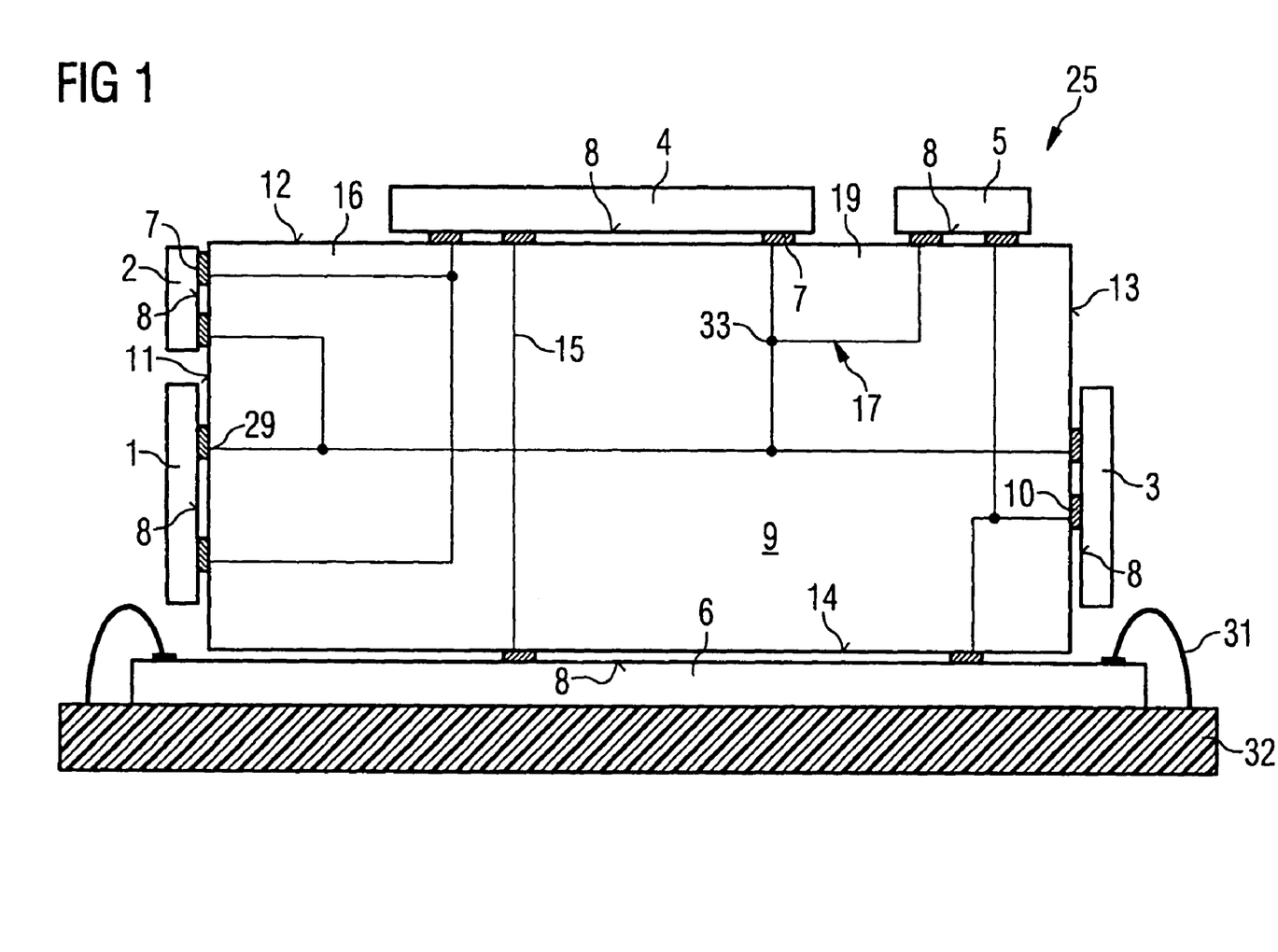
FIG. 1 illustrates a schematic cross section through an electronic module in accordance with a first embodiment of the invention.

FIG. 1 illustrates a module 25 with a wiring block 9 made of plastic 19 which has six outer sides, four outer sides 11, 12, 13 and 14 of which can be seen in this cross section. In this embodiment of the invention, the outer side 14 is simultaneously the underside of the wiring block 9 and has a component 6 in the form of a semiconductor chip having dimensions projecting beyond the wiring block, so that edge sides of the semiconductor chip are freely accessible and have contact areas. The rear side of the component 6 is adhesively bonded or soldered onto a superordinate circuit board 32 and the freely accessible contact areas arranged on the edge sides of the semiconductor chip are connected via bonding connections 31 to the superordinate circuit of the circuit board 32.

The wiring block 9 has at right angles to the underside 14 the outer sides 11 and 13, which are covered with the components 1 and 2 and with the component 3, respectively. The components 1, 2 and 3 have external contacts in the form of flip-chip contacts on their connection sides 8. The external contacts are arranged on corresponding contact pads 10 and connected to the lines 15 of the wiring block 9. Nodes 33 at which a plurality of lines are brought together are arranged within the wiring block 9. At the remaining crossover points, the lines are led past one another without touching one another. Consequently, the wiring block 9 provides a complex wiring in this cross section of six components, it being possible for the number of components 1, 2, 3, 4, 5 and 6 to be extended as desired to form an even larger electronic module.

Figure 2:
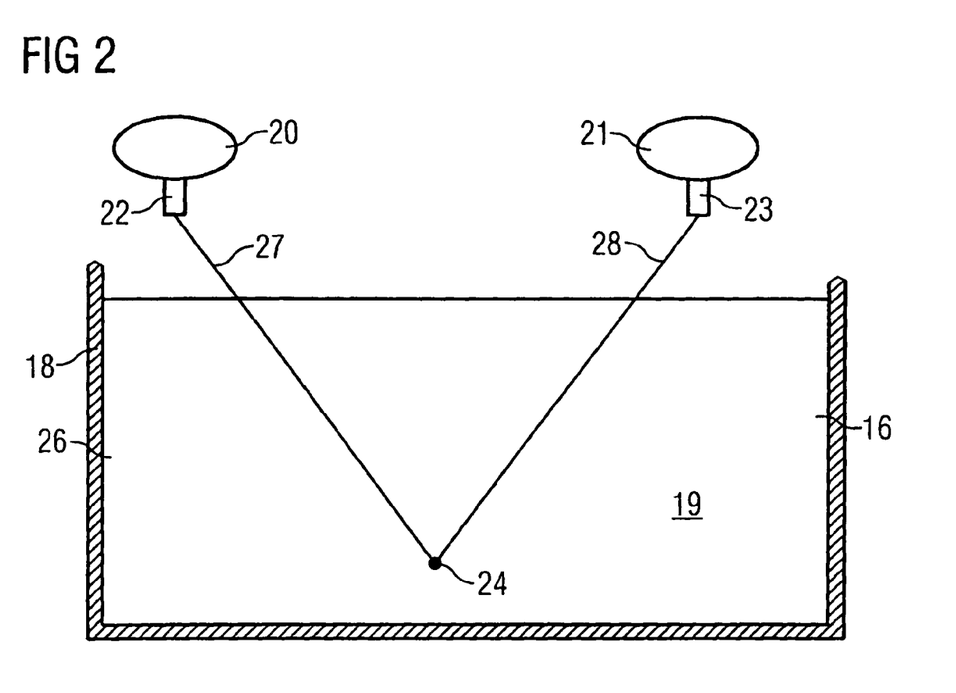
FIG. 2 illustrates a schematic diagram of a first embodiment of a device for producing an electronic module.

FIG. 2 illustrates a schematic diagram of a first embodiment of a device for producing an electronic module. This device has a casting mold 18, into which, in this embodiment of the invention, a transparent plastic 19 can be cast to form a plastic blank block 26. Furthermore, the device has a casting device (not shown) which can be used to fill the volume 16 of the casting mold 18 with the transparent plastic 19 to form the plastic blank block 26. On the transparent plastic 19 in its viscous form, from two energy sources 20 and 21 which overlap in terms of their focus region, energy beams 27 and 28 can be oriented onto the transparent plastic with the aid of orienting devices 22 and 23.

The transparent plastic 19 is not stressed during irradiation by individual energy sources 20 and 21, which are preferably realized by laser apparatuses. The focal point 24 can be guided through the volume 16 on any desired path, so that different conductor track structures can be described. The energy of each individual energy beam 27 and 28 is set such that it cannot yet by itself bring about carbonization in the plastic 19, but when the focus regions are superposed at the focal point 24 the carbon chains situated there are carbonized to form electrical lines 15.

Figure 3:
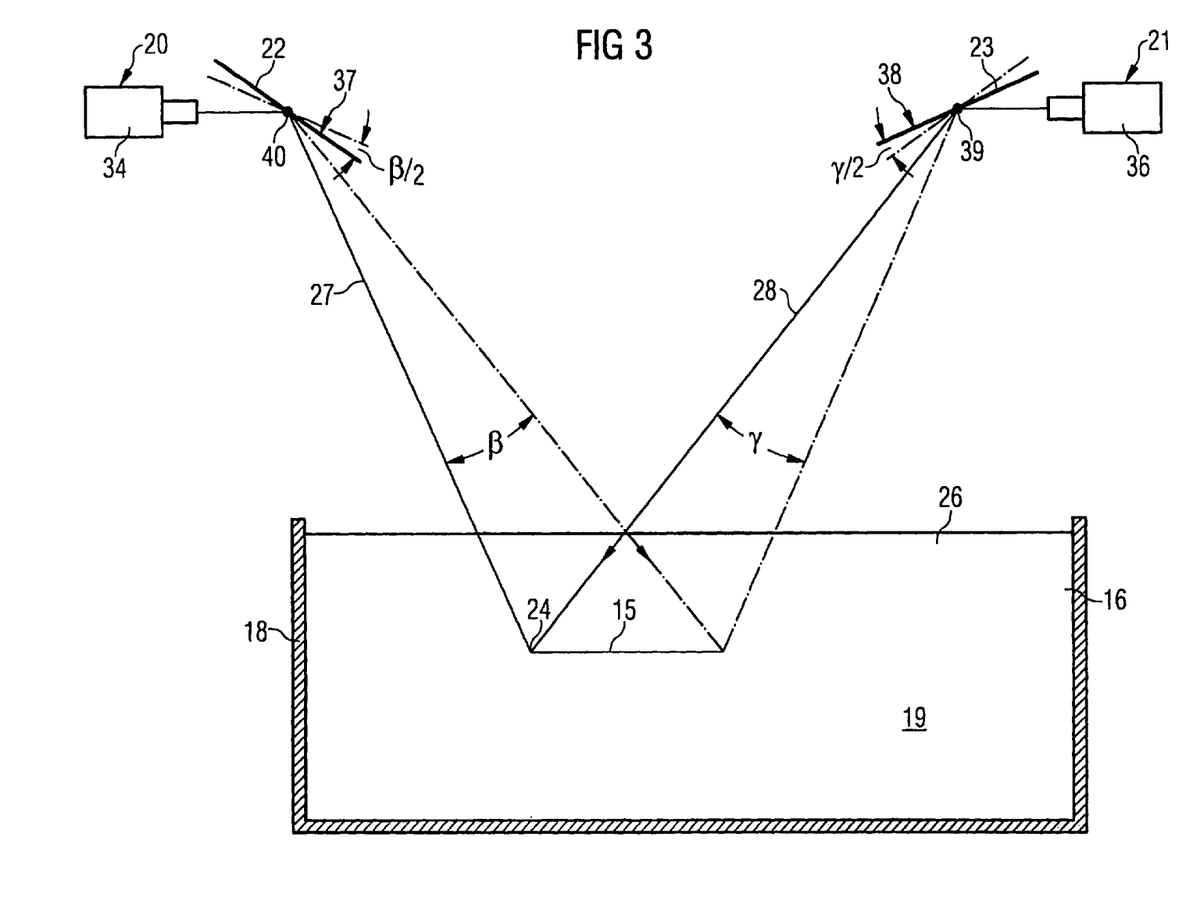
FIG. 3 illustrates a schematic diagram of a second embodiment of a device for producing an electronic module.

FIG. 3 illustrates a schematic diagram of a second embodiment of the device for producing an electronic module. In this second embodiment of the invention, the energy sources 20 and 21 are laser apparatuses 34 and 36, whose energy beams 27 and 28, respectively, are deflected by tilting mirrors as orienting devices 22 and 23. At a tilting angle of $\beta/2$ and $\gamma/2$, respectively, the laser beams 27 and 28 are displaced by the angle $\beta$ and $\gamma$, respectively, a superposition path in the form of a line 15 being marked in the plastic 19. By corresponding displacement of the focus regions, it is also possible to produce vertical lines or lines at any desired solid angle in the plastic 19 by means of the device of the second embodiment of the invention.

Figure 4:
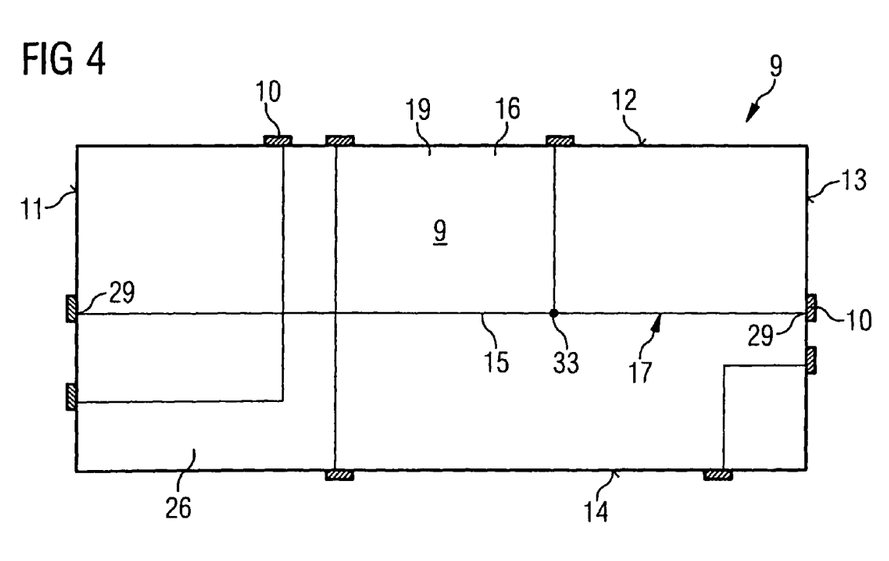
FIG. 4 illustrates a schematic cross section through a wiring block for an electronic module.

FIG. 4 illustrates a schematic cross section through a wiring block 9 for an electronic module. FIG. 4 thus specifies the result after all the conductor tracks have been produced and the plastic 19 has been cured, contact pads 10 made of metal being arranged at the piercing points 29 of the lines through the outer sides 11, 12, 13 and 14. Corresponding components are fitted on the contact pads 10 of the outer sides 11, 12, 13 and 14 in order to realize an electronic module. In contrast to the embodiment of the wiring block of FIG. 1, this wiring block exhibits only one node 33 of three lines 15 in accordance with a circuit layout 17.

Figure 5:
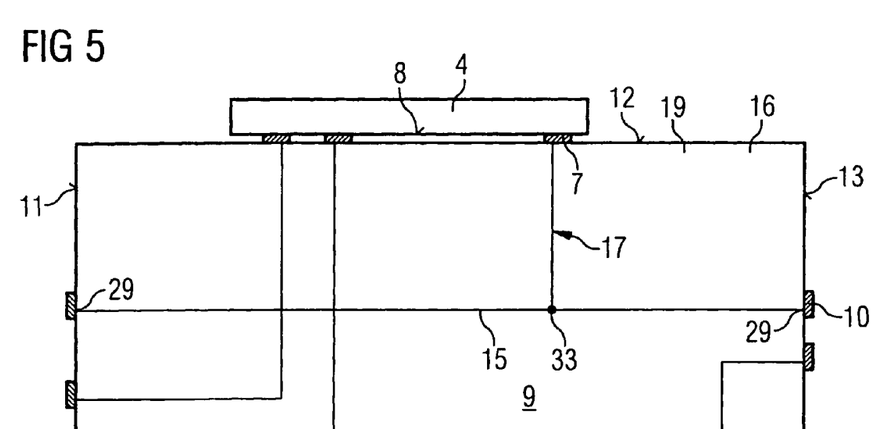
FIG. 5 illustrates a schematic cross section through a wiring block in accordance with FIG. 4 with a first connected semiconductor chip.

FIG. 5 illustrates a schematic cross section through a wiring block 9 in accordance with FIG. 4 with a first connected component 4. Said component 4 is fitted on the outer side 12 and connected to the contact pads 10 by its component connections 7. Components having functions identical to those in the previous figures are identified by the same reference symbols and are not discussed separately.

By means of this relatively simple circuit or wiring layout 17 of the wiring block 9, further electronic components are interconnected by means of lines 15.

Figure 6:
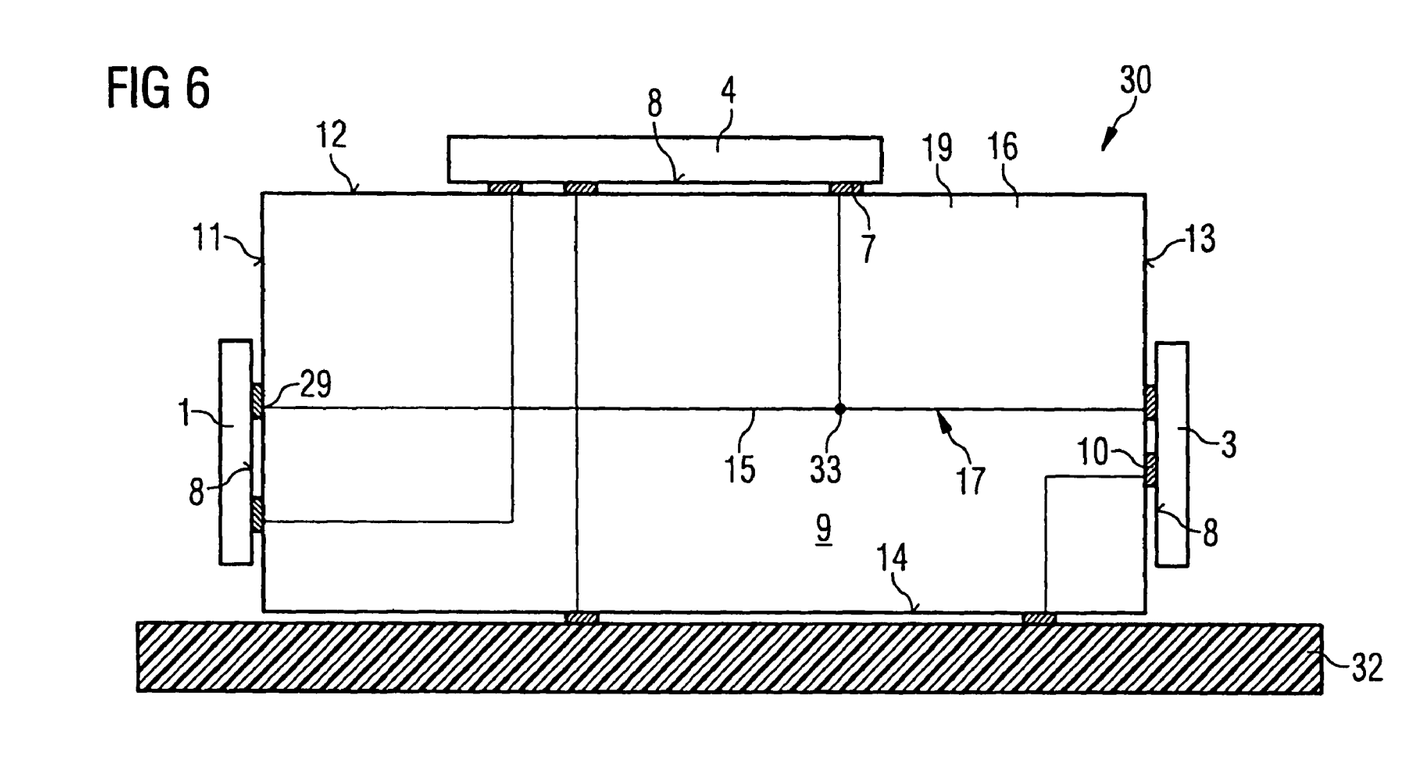
FIG. 6 illustrates a schematic cross section through a wiring block in accordance with FIG. 5 with three connected semiconductor chips to form an electronic module of a second embodiment of the invention.

FIG. 6 illustrates a schematic cross section through a wiring block 9 in accordance with FIG. 5 with three connected components 1, 3, 4 to form an electronic module 30 of a second embodiment of the invention. This module 30 is arranged with the underside 14 of the wiring block 9 on a circuit board 32 of a superordinate circuit. Via the wiring block 9, with the circuit board 32, it is possible for all the connections 7 of the three components 1, 3 and 4 shown here to be connected to corresponding lines of the circuit board 32.

Figure 7:
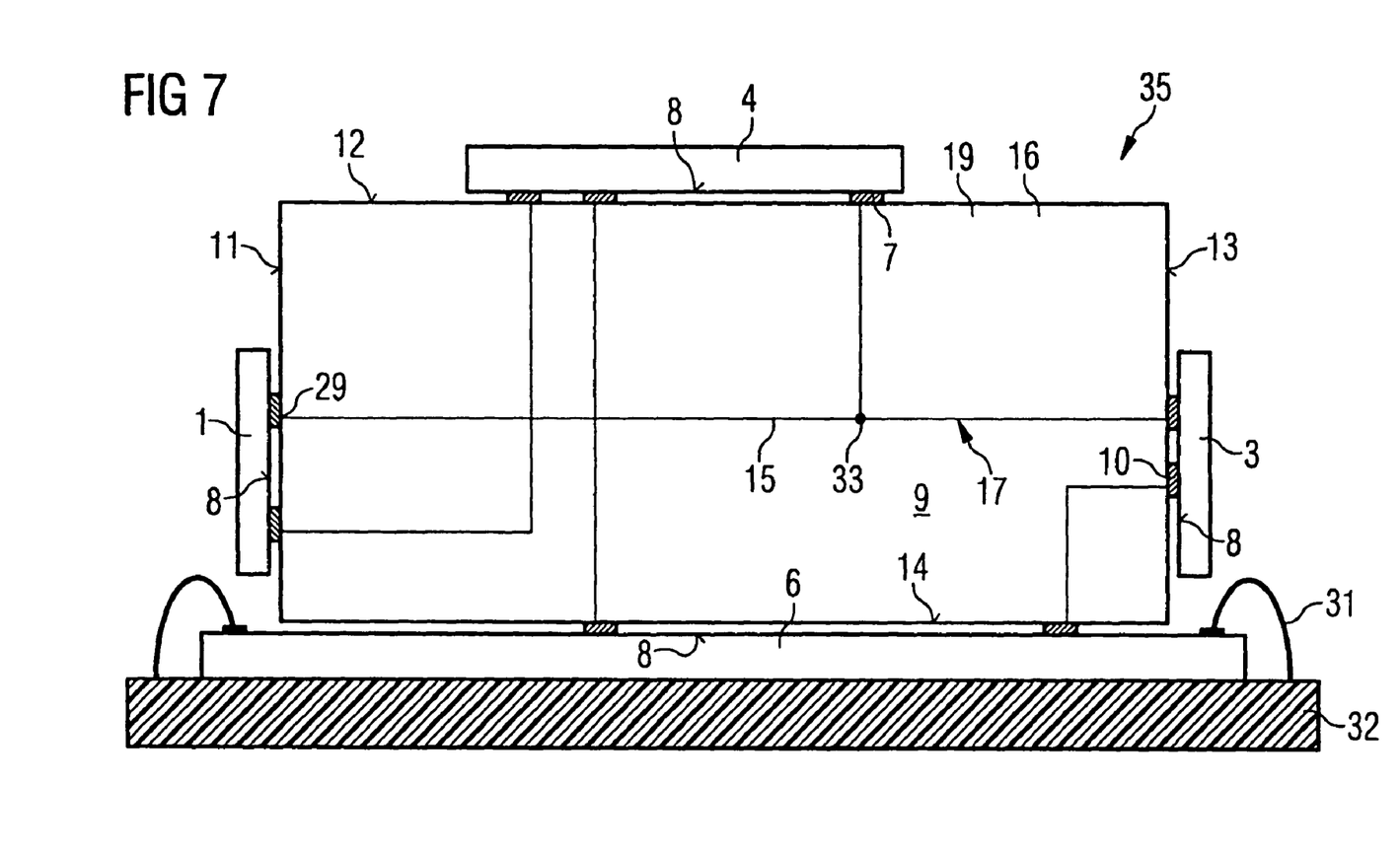
FIG. 7 illustrates a schematic cross section through a wiring block in accordance with FIG. 6 with four connected semiconductor chips to form an electronic module of a third embodiment of the invention.

FIG. 7 illustrates a schematic cross section through a wiring block 9 of FIG. 6 with four connected components 1, 3, 4 and 6 to form an electronic module 35 of a third embodiment of the invention. Components having functions identical to those in previous figures are identified by the same reference symbols and are not discussed separately.

This third embodiment of the invention in accordance with FIG. 7 has a large-area electronic component 6 on the outer side 14 of the wiring block 9, in a manner similar to that of FIG. 1, which is electrically connected via bonding connections 31 to a circuit subboard 32 and is fixed by its rear side on the circuit subboard 32.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. An electronic module comprising:
   a first and a second component with connections on connection sides of the components;
   a wiring block made of plastic with contact pads on its outer sides and with lines comprising nanoparticles with carbonized short-circuit paths between the nanoparticles in its volume, the lines electrically connecting the contact pads on the outer sides to one another according to a circuit layout, the first component and the second component being arranged on different non-opposite outer sides of the wiring block and the connections being connected to the contact pads.

2. The electronic module according to claim 1, comprising wherein the wiring block includes at least six outer sides.

3. The electronic module according to claim 1, comprising wherein the contacts of the first and second components are flip-chip contacts.

4. An electronic module comprising:
   a first and a second component with connections on connection sides of the components;
   a wiring block made of plastic with contact pads on its outer sides and with lines comprising anisotropically oriented nanoparticles in its volume, the lines electrically connecting the contact pads on the outer sides to one another according to a circuit layout, the first component and the second component being arranged on different non-opposite outer sides of the wiring block and the connections being connected to the contact pads.

5. An electronic module comprising:
   a first and a second component with connections on connection sides of the components;
   a wiring block made of plastic with contact pads on its outer sides and with lines in its volume, the lines electrically connecting the contact pads on the outer sides to one another according to a circuit layout, the first component and the second component being arranged on different non-opposite outer sides of the wiring block and the connections being connected to the contact pads;
   wherein the lines comprise carbonized plastic, the lines including nanoparticles with carbonized short-circuit paths between the nanoparticles, and wherein the lines comprise anisotropically oriented nanoparticles.

6. An electronic module comprising:
   a first and a second component with connections on connection sides of the components;
   a wiring block with contact pads on its outer sides and with lines comprising nanoparticles with carbonized short-circuit paths between the nanoparticles in its volume, the lines electrically connecting the contact pads on the outer sides to one another according to a defined circuit layout, the first component and the second component being arranged on different outer sides of the wiring block and the connections being connected to the contact pads;
   wherein the wiring block includes a plastic volume through which the lines extend, and includes at least six outer sides configured for population with electronic devices or components, such that line routing through the wiring block is configurable for three-dimensional wiring between contact pads.

7. The electronic module according to claim 6, comprising the wiring block including vertical line routing, horizontal line routing, or line routing at different solid angles, thereby achieving reduced length wiring paths and reducing propagation time delays within the wiring block.

8. The electronic module according to claim 6, comprising wherein a configuration of the line routing is three-dimensional.

9. The electronic module according to claim 6, comprising wherein the line routing includes one or more lines configured as a sheet.

10. The electronic module according to claim 6, comprising wherein routing lines are configured as an electrical component.

11. The electronic module according to claim 6, comprising wherein the lines comprise carbonized plastic.

12. The electronic module according to claim 8, comprising wherein the line routing is configured as a spiral.

13. The electronic module according to claim 10, wherein the electrical component is a passive electrical component.

14. The electronic module according to claim 10, wherein the electrical component is an inductive component.

15. The electronic module according to claim 10, wherein the electrical component is a capacitive component.

16. An electronic module comprising:
   a first and a second component with connections on connection sides of the components;
   a wiring block with contact pads on its outer sides and with lines comprising anisotropically oriented nanoparticles in its volume, the lines electrically connecting the contact pads on the outer sides to one another according to a defined circuit layout, the first component and the second component being arranged on different outer sides of the wiring block and the connections being connected to the contact pads;
   wherein the wiring block includes a plastic volume through which the hues extend, and includes at least six outer sides configured for population with electronic devices or components, such that line routing through the wiring block is configurable for three-dimensional wiring between contact pads.

17. An electronic module comprising:
   a first and a second component with connections on connection sides of the components;
   a wiring block made of plastic with nanoparticles and having contact pads on its outer sides and with lines in its volume, the lines electrically connecting the contact pads on the outer sides to one another according to a circuit layout, the first component and the second component being arranged on different lion-opposite outer sides of the wiring block and the connections being connected to the contact pads.

* * * * *

UNITED STATES PATENT AND TRADEMARK OFFICE
CERTIFICATE OF CORRECTION

PATENT NO. : 7,602,614 B2  Page 1 of 1
APPLICATION NO. : 10/562252
DATED : October 13, 2009
INVENTOR(S) : Bauer et al.

It is certified that error appears in the above-identified patent and that said Letters Patent is hereby corrected as shown below:

Column 8, line 45, delete "hues" and insert in place thereof --lines--.

Column 8, line 58, delete "lion-opposite" and insert in place thereof --non-opposite--.

Signed and Sealed this

Ninth Day of February, 2010

David J. Kappos
*Director of the United States Patent and Trademark Office*